(12) United States Patent
Sofue et al.

(10) Patent No.: US 6,445,068 B1
(45) Date of Patent: Sep. 3, 2002

(54) SEMICONDUCTOR MODULE (75) Inventors: Kenichi Sofue; Hiromitsu Yoshiyama; Toshinari Fukatsu; Toshiaki Nagase, all of Aichi-ken (JP)

(73) Assignee: Kabushiki Kaisha Toyoda Jidoshokki Seisakusho, Kariya (JP)

( * ) Notice: Subject to any disclaimer, the term of this patent is extended or adjusted under 35 U.S.C. 154(b) by 0 days.

(21) Appl. No.: 09/498,595

(22) Filed: Feb. 4, 2000

(30) Foreign Application Priority Data

Feb. 5, 1999 (JP) .......................................... 11-028213
Jan. 21, 2000 (JP) ......................................... 2000-012573

(51) Int. Cl.[7] .............................................. H01L 23/34
(52) U.S. Cl. ....................... 257/723; 257/724; 257/725; 257/691; 257/579; 257/578; 257/784
(58) Field of Search .................................. 257/723, 724, 257/725, 401, 8, 691, 579, 578, 784

(56) References Cited

U.S. PATENT DOCUMENTS

| | | | |
|---|---|---|---|
| 4,907,068 A | * | 3/1990 | Amann et al. ................. 357/74 |
| 5,043,859 A | | 8/1991 | Korman et al. ............. 363/147 |
| 5,060,048 A | | 10/1991 | Hebenstreit et al. ........ 257/208 |

FOREIGN PATENT DOCUMENTS

| | | | |
|---|---|---|---|
| EP | 0 553 981 A2 | 8/1993 | ........... H01L/25/07 |
| JP | 411163240 A | * 6/1999 | |
| JP | 11-177021 | 7/1999 | |

* cited by examiner

*Primary Examiner*—David L. Talbott
*Assistant Examiner*—Luan Thai
(74) *Attorney, Agent, or Firm*—Morgan & Finnegan, LLP (57) ABSTRACT

A plurality of MOS transistors are arranged on the top surface of a conductor substrate which is a drain electrode. The drain contact of each MOS transistor is connected to the conductor substrate. The source contact of each MOS transistor is connected to the output conductor path which is a source electrode through a bonding wire. The gate contact of each MOS transistor is connected to a drive signal conductor path which is a gate electrode through a bonding wire. The source contacts of the MOS transistors are interconnected through a bridge electrode and a bonding wire.

4 Claims, 7 Drawing Sheets

F I G. 1

PRIOR ART

FIG. 2

PRIOR ART

FIG. 7 the description of the MOS transistor. In this case, when the voltage applied to the output terminal is set to a value lower than a predetermined value, each diode is turned off. In this case, the forward current IF decreases with time, and returns to zero (0) after it becomes negative. The process of the forward current IF returning from a negative value to zero is referred to as 'recovery'.
SEMICONDUCTOR MODULE

BACKGROUND OF THE INVENTION

1. Field of the Invention

The present invention relates to a semiconductor module in which a plurality of semiconductor elements are interconnected in parallel to each other, and more specifically to a technology of improving the characteristic of a semiconductor module in which a plurality of MOS transistors are interconnected in parallel to each other.

2. Description of the Related Art

A semiconductor module in which a plurality of semiconductor elements are interconnected in parallel to each other is used as, for example, a switch for controlling an large electric current. In this case, each semiconductor element is, for example, a MOS transistor having the same characteristic.

Figure 1:
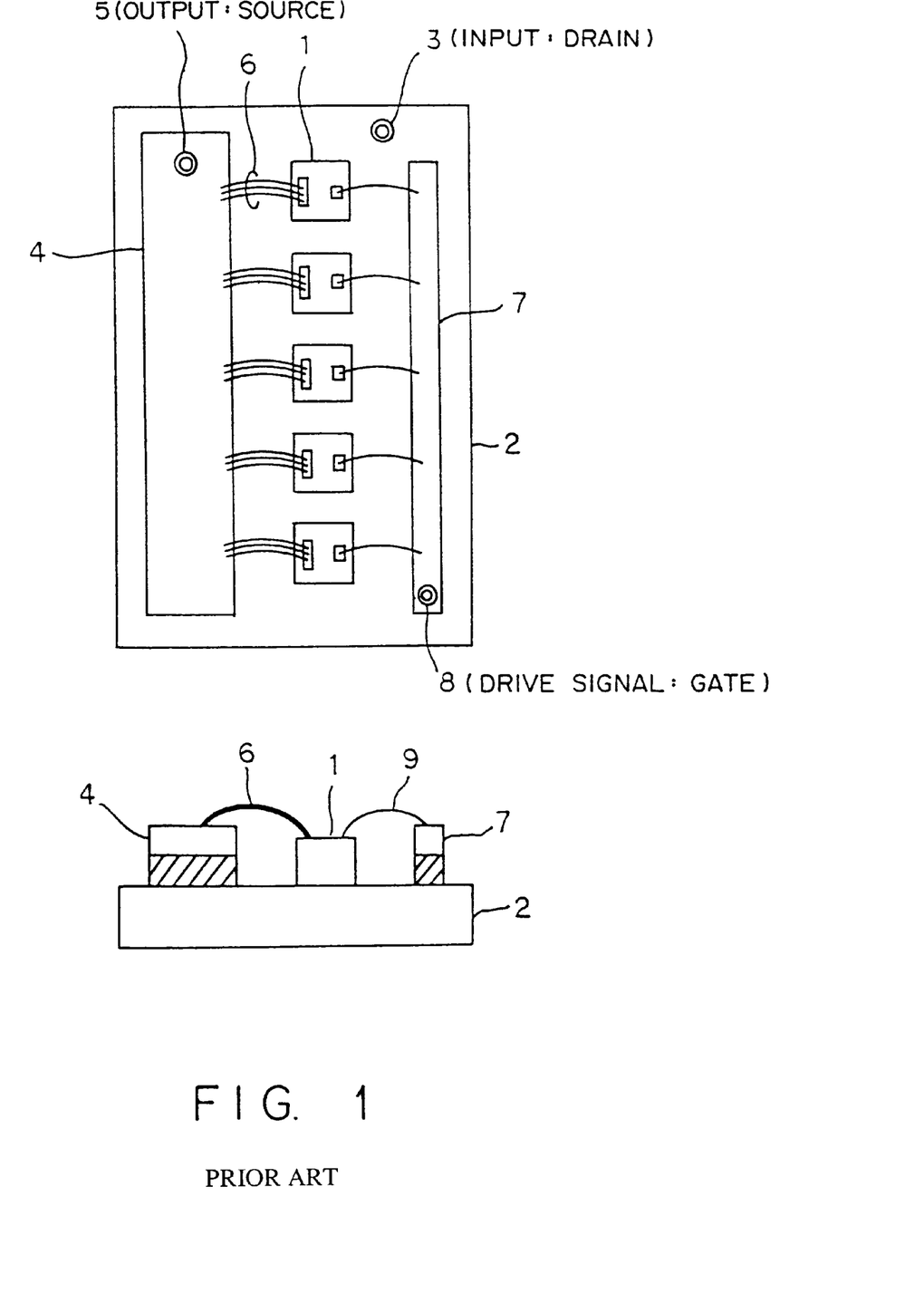
FIG. 1 shows an example of the existing semiconductor module in which a plurality of semiconductor elements are connected in parallel to each other.

FIG. 1 shows an example of an existing semiconductor module in which a plurality of semiconductor elements are interconnected in parallel to each other. Described below is each semiconductor element as a MOS transistor.

A plurality of MOS transistors 1 are arranged on the top surface of a conductor substrate 2. The conductor substrate 2 is a drain electrode to which the drain contact of each MOS transistor 1 is connected. In addition, an input terminal (drain terminal) 3 is connected to the conductor substrate 2. An output conductor path 4 is a source electrode to which an output terminal (source terminal) 5 is connected. Furthermore, the source contact of each MOS transistor 1 and the output conductor path 4 are interconnected through a bonding wire 6. A drive signal conductor path 7 is a gate electrode to which a drive signal terminal (gate terminal) 8 is connected. In addition, the gate contact of each MOS transistor 1 and the drive signal conductor path 7 are interconnected through a bonding wire 9. These bonding wires can be, for example, metal wires of aluminum, etc. Each of the output conductor path 4 and the drive signal conductor path 7 is electrically isolated from the conductor substrate 2.

Figure 2:
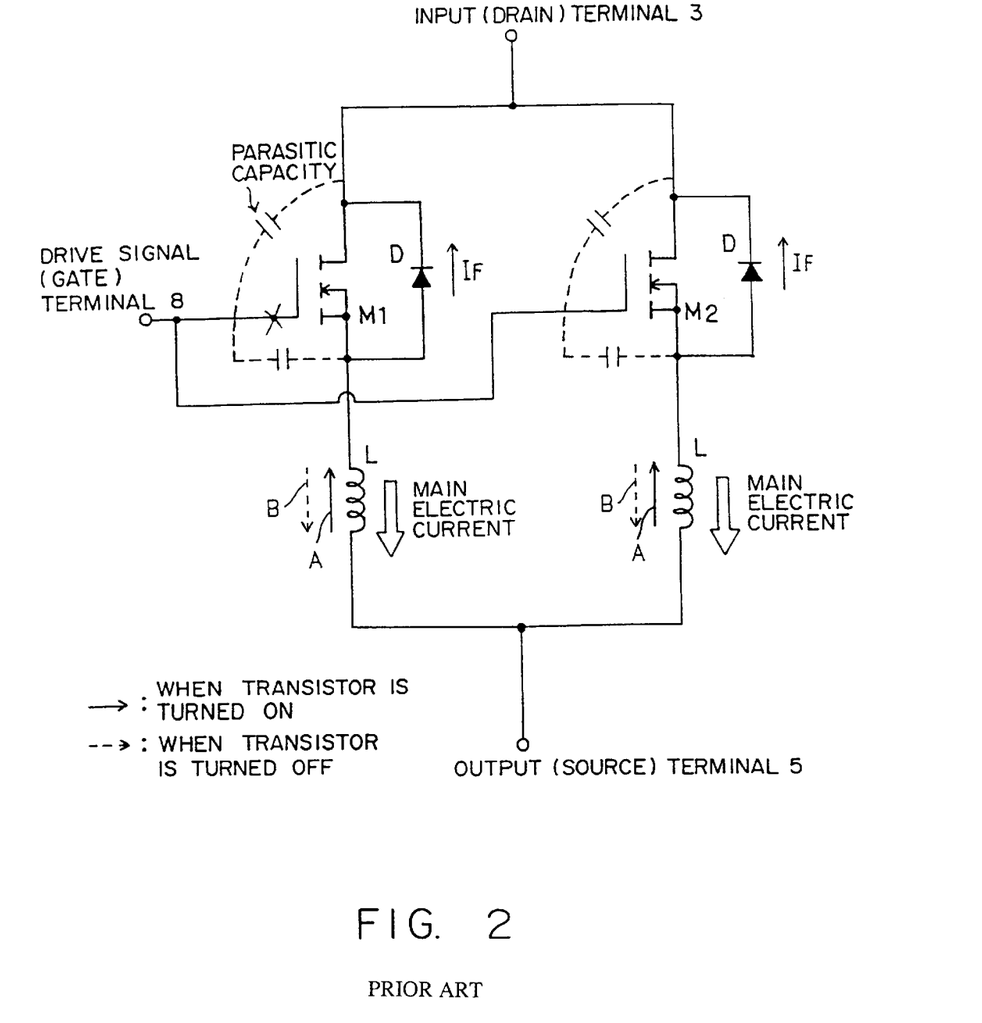
FIG. 2 shows the circuit of the semiconductor module shown in FIG. 1.

FIG. 2 shows the circuit of the semiconductor module shown in FIG. 1. In this example, two MOS transistors M1 and M2 are connected in parallel as a plurality of MOS transistors 1. A diode D is provided as parasitic to each MOS transistor. An inductor L is an inductance of the bonding wire 6 (or the bonding wire 6 and the output conductor path 4) which is a path through which a main current flows.

When a voltage higher than a predetermined value (gate threshold voltage) is applied between the output terminal 5 and the drive signal terminal 8, the MOS transistors M1 and M2 are turned on. If the voltage can be maintained, the MOS transistors M1 and M2 maintain the ON state, and the main current can flow from the input terminal 3 to the output terminal 5. On the other hand, when the voltage between the output terminal 5 and the drive signal terminal 8 is lowered than the predetermined value, the MOS transistors M1 and M2 are turned off.

When the MOS transistors are turned on or off as described above, the main current changes. That is, the main current sharply increases when they are turned on, and sharply decreases when they are turned off. If the current through the inductor changes, then, as it is well-known, a voltage decreasing the speed of the current change is generated.

Therefore, when the MOS transistors M1 and M2 are turned on, a voltage allowing a current to flow in the arrow A direction is generated by the inductor L. Therefore, the increasing speed of the main current is lowered, thereby the switching speed is also lowered. When the MOS transistors M1 and M2 are turned off, a voltage allowing a current to flow in the arrow B direction is generated. Therefore, the decreasing speed of the main current is lowered, thereby also lowering the switching speed. Thus, when the switching speed is reduced, the change rate of the main current is lowered. Therefore, the surge voltage whose level is proportional to di/dt also becomes lower. Thus, in the semiconductor module shown in FIG. 1, a large surge voltage is prevented from being generated by the inductance of the bonding wire 6.

The MOS transistors M1 and M2 can be used as diodes. In this case, when the voltage applied to the output terminal 5 is higher than the voltage applied to the input terminal 3, the forward current IF flows through each diode. When the forward voltage for the diode is set to a value lower than a predetermined value, each diode is turned off. In this case, the forward current IF decreases with time, and returns to zero (0) after it becomes negative. The process of the forward current IF returning from a negative value to zero is referred to as 'recovery'.

At the recovery of the diode D, the forward current IF increase, and the inductor L generates a voltage which delays a change of the current. Thus, although the potential of the input terminal 3 instantly rises, the MOS transistor normally has a parasitic capacity between the gate and the drain. Therefore, the potential is supplied to the gate of the MOS transistor through the parasitic capacity. As a result, the MOS transistor instantly enters ON state, and the voltage generated when the diode D recovers is absorbed by the MOS transistor.

In a semiconductor module with the above described configuration, it is difficult to make the inductances of the MOS transistors match each other. That is, since it is difficult to make the lengths of the bonding wires 6 of the MOS transistors match each other, thereby causing non-uniform inductances of main current paths for respective MOS transistors. In addition, when the paths of the main currents of respective MOS transistors, that is, the paths from the input terminal 3 to the output terminal 5 through respective MOS transistors, are compared with each other, the length of the output conductor path 4 depends on the position of each MOS transistor, thereby also causing non-uniform inductances of the MOS transistors.

When the inductances of the MOS transistors are not uniform with each other, a large surge voltage may be generated in a specific MOS transistor in a plurality of MOS transistors, or a current may be concentrated on a specific MOS transistor.

Regardless of the inductance of a MOS transistor, uneven characteristics (for example, a gate threshold voltage) of MOS transistors may also cause non-uniform operations.

SUMMARY OF THE INVENTION

The present invention aims at solving the above described problem, and leveling the operations of a plurality of semiconductor elements in a semiconductor module in which the plurality of semiconductor elements are interconnected in parallel to each other.

The semiconductor module of the present invention has a plurality of semiconductor elements interconnected in parallel to each other, and includes a first conductor, connected to each of the main current input contact areas of the plurality of semiconductor elements, for inputting the main current flowing through the plurality of semiconductor elements; a second conductor, connected to each of the main current output contact areas of the plurality of semiconductor elements, for outputting the main current; and a third conductor, connected to each of the drive signal input contact areas of the plurality of semiconductor elements. The plurality of semiconductor elements are drive-controlled based on the potential difference provided through the second and third conductors. Then, each of the main current output contact areas of the plurality of semiconductor elements is interconnected to each other through a fourth conductor.

With the above described semiconductor module, the plurality of semiconductor elements are drive-controlled based on the potential difference provided through the third conductor and the second conductor which is the path through which the main current flows. Therefore, when the semiconductor elements are switched, an induction voltage lowering the speed of changing the current is generated by the inductance of the second conductor. As a result, the switching speed can be prevented from being exceedingly high, thereby reducing the surge voltage.

In addition, when the inductances of the paths through which the main current flows are different among the semiconductor elements, generated induction voltages are also different among the semiconductor elements. However, the difference in induction voltage can be compensated for by flowing a current through the fourth conductor. Therefore, the operations of the plurality of semiconductor elements can be levelled.

In the semiconductor module according to another aspect of the present invention, only the main current output contact areas of the semiconductor elements provided at a predetermined interval or further from the second conductor in the plurality of semiconductor elements are interconnected through the fourth conductor. The path of the main current flowing through the semiconductor elements provided near the second conductor is short and small in inductance, it is not necessary to compensate for the current generated by the induction voltage using the fourth conductor.

DESCRIPTION OF THE PREFERRED EMBODIMENTS

The embodiments of the present invention are described below by referring to the attached drawings.

Figure 3:
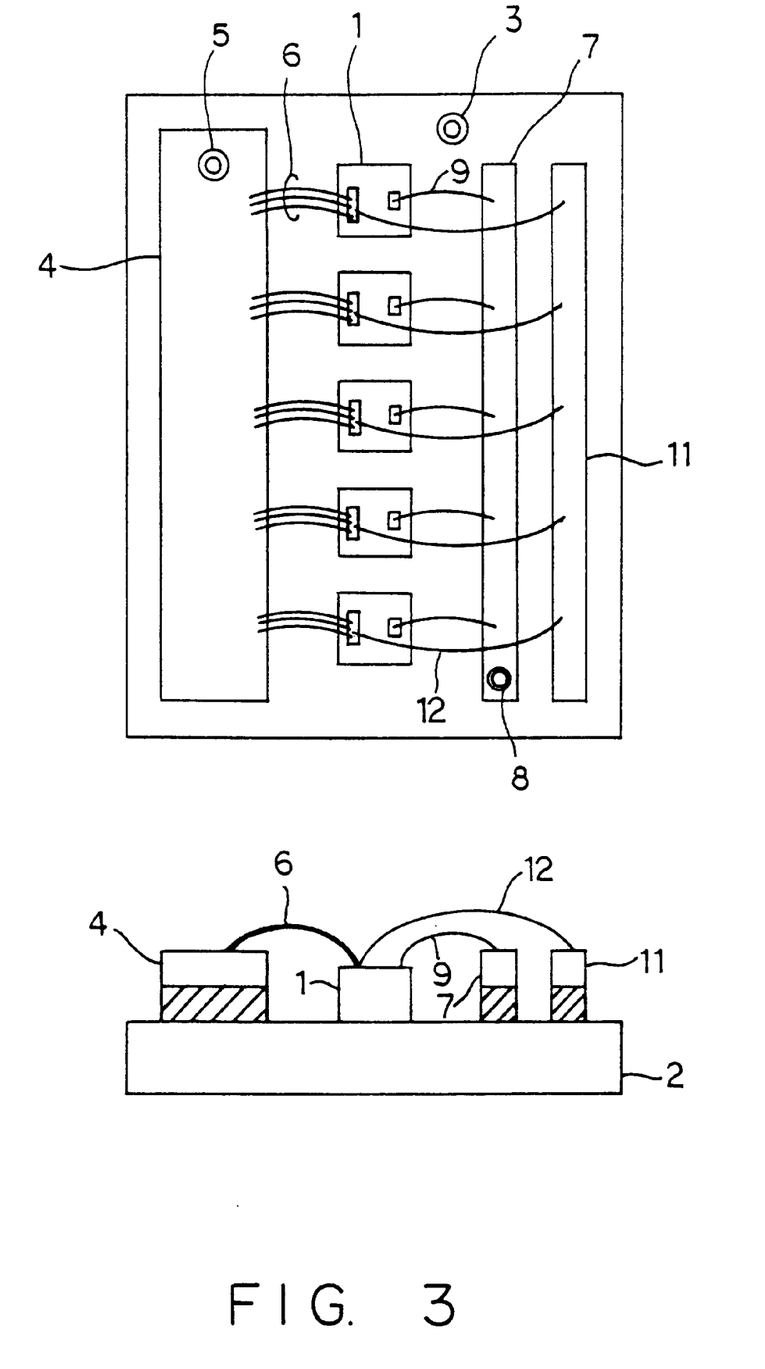
FIG. 3 shows the semiconductor module according to the embodiments of the present invention.

FIG. 3 shows the semiconductor module according to the present embodiment. In FIG. 3, the unit numbers also shown in FIG. 1 refer to the identical units. That is, among the semiconductor module according to the present embodiment, the plurality of MOS transistors 1, the conductor substrate (drain electrode) 2, the input terminal (drain terminal) 3, the output conductor path (source electrode) 4, the output terminal (source terminal) 5, the bonding wires 6 and 9, the drive signal conductor path (gate electrode) 7, and the drive signal terminal (gate terminal) 8 can be the same as the existing semiconductor module.

The semiconductor module according to the present embodiment can be realized by interconnecting the source contacts of the plurality of MOS transistors 1 through a path different from the output conductor path 4 and the bonding wire 6. Practically, the semiconductor module according to the present embodiment can be realized by providing a bridge electrode 11 for the existing semiconductor module shown in FIG. 1, and by interconnecting the source contacts of the plurality of MOS transistors 1 with the bridge electrodes 11 through a bonding wire 12.

Figure 4:
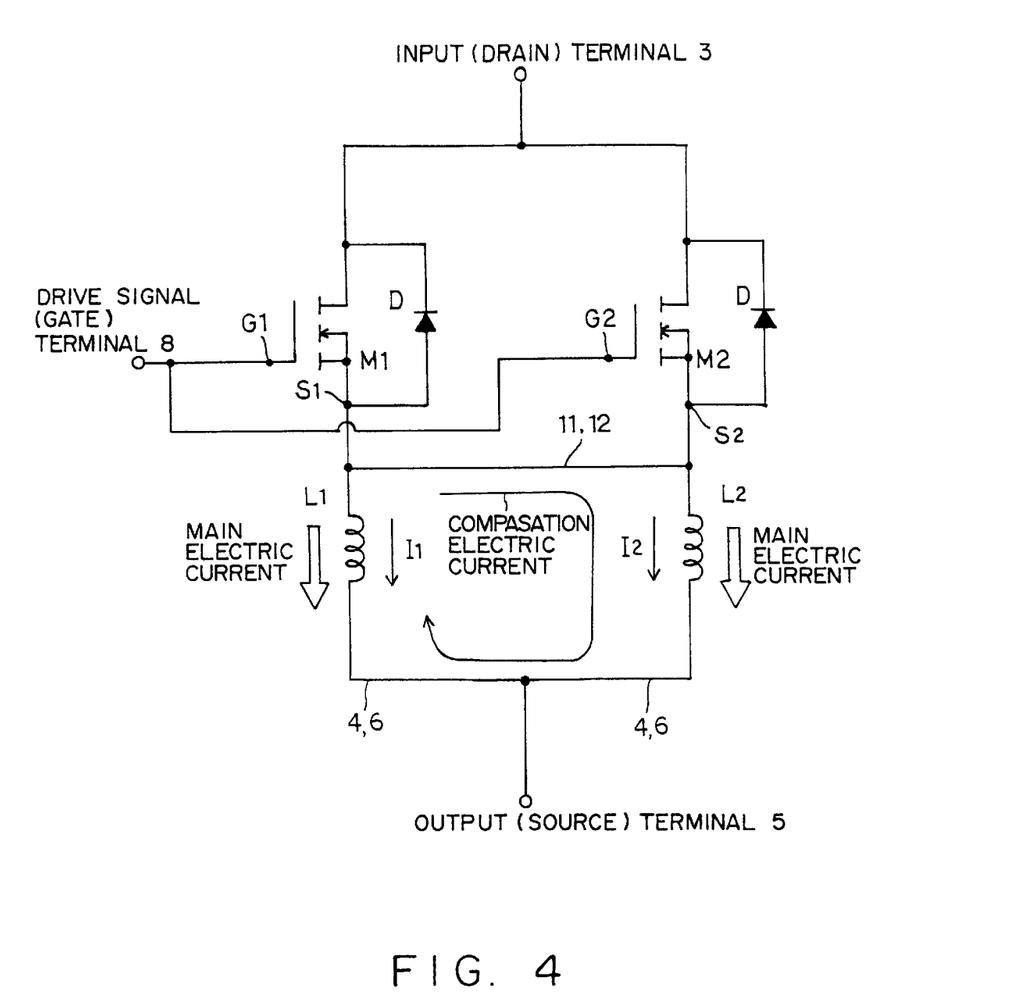
FIG. 4 shows the circuit of the semiconductor module according to the embodiment of the present invention.

FIG. 4 shows the circuit of the semiconductor module according to the present embodiment. In this example, two MOS transistors M1 and M2 are connected in parallel with each other as a plurality of MOS transistors 1 as an example shown in FIG. 2. In addition, the points S1 and S2 respectively refer to the source contact areas of the MOS transistors M1 and M2 are interconnected through the bridge electrode 11 and the bonding wire 12.

In the above semiconductor module, a signal for use in turning on or off the MOS transistors M1 and M2 is basically the same as the existing module shown in FIG. 1. That is to say, a voltage having a value higher than a predetermined value (gate threshold value) is applied between the output terminal 5 and the drive signal terminal 8 in order to turn on the MOS transistors M1 and M2. Then, if the voltage is maintained, the MOS transistors M1 and M2 maintain the ON state, and a main current flows from the input terminal 3 to the output terminal 5. Most of the main current flows to the output terminal 5 through the bonding wire 6, but the main current rarely flows through the bridge electrode 11 or the bonding wire 12. On the other hand, the voltage between the output terminal 5 and the drive signal terminal 8 is reduced to the value smaller than the predetermined value in order to turn off the MOS transistors M1 and M2.

The principle of levelling the operations of a plurality of MOS transistors when the semiconductor module with the above described configuration is switched is described below. Here, a case that the MOS transistors M1 and M2 are turned off is explained.

When the MOS transistors M1 and M2 are turned off, the voltage between the output terminal 5 and the drive signal terminal 8 is reduced to the value smaller than the predetermined value. At this time, since the main current sharply decreases, the inductors L1 and L2 generate a voltage (hereinafter referred to as a 'induction voltage') which lowers the decreasing speeds of the respective main currents. Therefore, the switching speed of the MOS transistors M1 and M2 can be prevented from being too high, thereby reducing the surge voltage.

However, it is difficult to level the induction voltage for the plurality of MOS transistors connected in parallel to each other. That is, since the induction voltage is represented as a product of the inductance of the path of a current times the change rate of the current, the induction voltage of each MOS transistor can be different from each other depending on the product.

Figure 5:
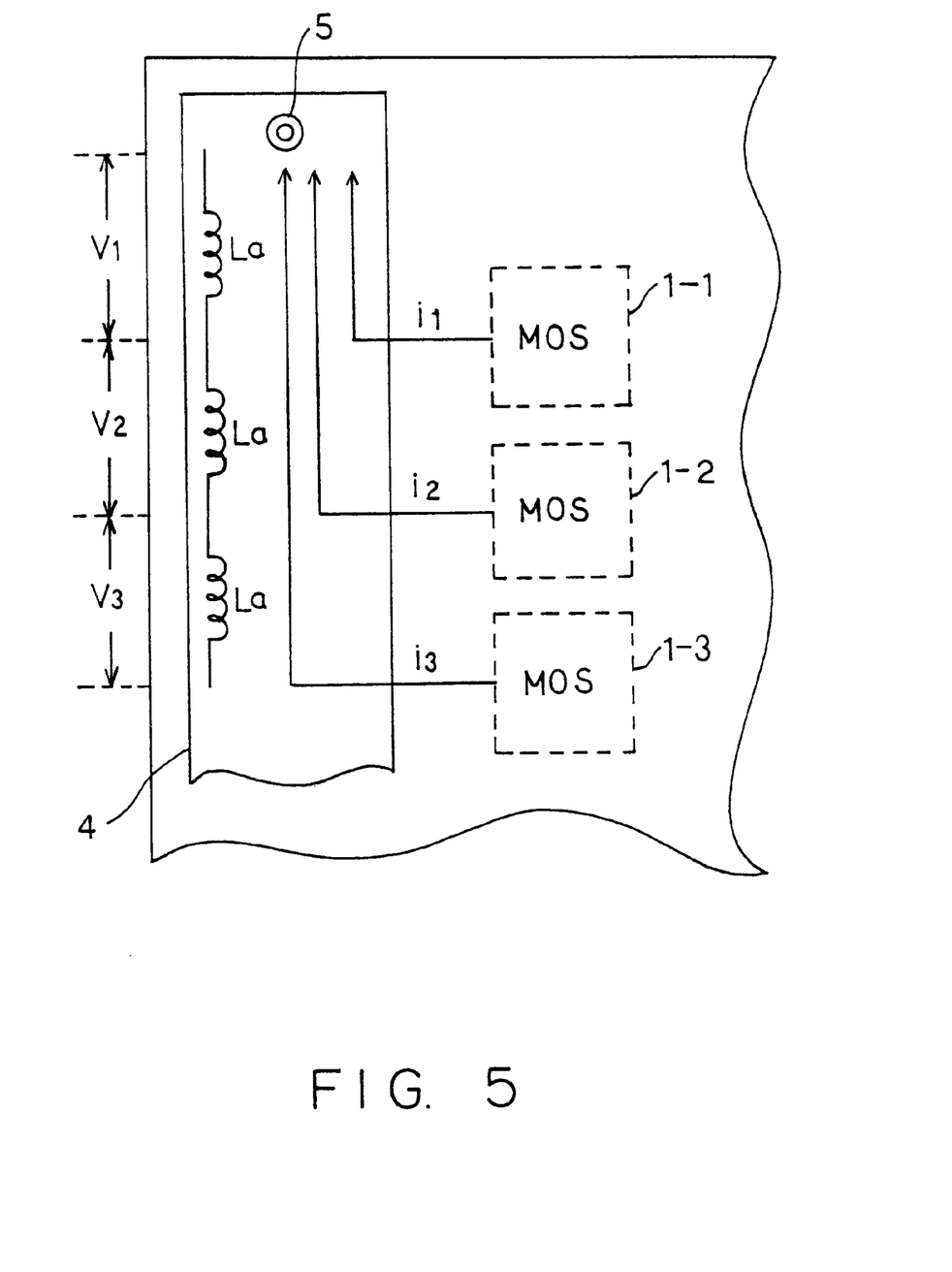
FIG. 5 shows that the induction voltage depends on the position of the MOS transistor.

Practically, the path from each MOS transistor to the output terminal 5 in the paths of the main currents of the MOS transistors depends on the MOS transistor as shown in FIG. 5. Especially, it depends on the position of each MOS transistors. Therefore, the inductance of the path of a main current necessarily depends on each MOS transistor. In addition, if the changes of the main currents of the MOS transistors 1-1 through 1-3 are respectively 'di1/dt', 'di2/dt', and 'di3/dt', and the inductance of the output conductor path 4 is constant, then the induction voltages V1 through V3 generated depending on the changes of the currents can be represented by the following equation.

$$V_3 = La \cdot \frac{di_3}{dt}$$

$$V_2 = La \cdot \frac{di_2 + di_3}{dt}$$

$$V_1 = La \cdot \frac{di_1 + di_2 + di_3}{dt}$$

Thus, with the configuration in which a plurality of MOS transistors are connected in parallel to each other, the induction voltage generated by the inductor at the switching operation is different from others for each MOS transistor depending on the position of each MOS transistor. The difference of the induction voltage can be generated by the inductance difference of each bonding wire 6 of the plurality of MOS transistors, or the difference in switching characteristic, etc. of each MOS transistor. That is, the larger the inductance of the bonding wire for the main current is, or the higher the switching speed of the MOS transistor is, the larger the generated induction voltage becomes.

The induction voltage caused by a change of a main current is generated such that the speed of changing the current is lowered as described above. For example, in FIG. 4, when the MOS transistors are turned off, an induction voltage is generated such that a current I1 can flow through the MOS transistor M1, and an induction voltage is generated such that a current I2 can flow through the MOS transistor M2. If the current I1<the current I2, then a compensation current for compensation for the difference flows through the bridge electrode 11 and the bonding wire 12 as shown in FIG. 4. Using the compensation electric current, the decreasing speed of a main current in the MOS transistor having a higher induction voltage is lowered, and the decreasing speed of a main current in the MOS transistor having a lower induction voltage is increased. As a result, the decreasing speed of each main current can be levelled in the plurality of MOS transistors, and a large surge voltage in a specific MOS transistor can be avoided, or a current can be prevented from concentrating on a specific MOS transistor.

Since the bridge electrode 11 and the bonding wire 12 have inductances, the inductance of a path of a compensation current depends on whether the compensation current flows between the MOS transistors close to each other, or the compensation current flows between the MOS transistors far away from each other in a module in which a number of MOS transistors are connected in parallel to each other. However, since the main current rarely flows through the bridge electrode 11 and the bonding wire 12, and the compensation current is sufficiently smaller than the main current, the current change rate in the path is small enough to be ignored. Therefore, it is considered that the inductances of the bridge electrode 11 and the bonding wire 12 can be ignored.

When the MOS transistors are turned on, or when the MOS transistors are used as diodes and the diodes are turned off, the operations of the elements can be levelled by the similar effect. That is, when the MOS transistors are turned on, the increasing speed of the main current can be levelled by the compensation current. When the diodes are turned off, the increasing speed (the decreasing speed of a current when it is considered to be MOS transistors) of the forward current of the diodes can be levelled by a compensation current.

Thus, since the semiconductor module according to the present embodiment has a path for a compensation current for compensating for the difference in induction voltage generated for each MOS transistor in a switching operation, the operations of a plurality of MOS transistors can be levelled. In addition, since each MOS transistor is drive-controlled based on the potential difference between the drive signal conductor path (gate electrode) 7 and the output conductor path (source electrode) 4, the switching speed can be prevented from being too high, and the surge voltage can be reduced. That is to say, according to the semiconductor module of the present embodiment, the operations of a plurality of MOS transistors can be levelled with the surge voltage reduced.

According to the above described embodiment, a plurality of MOS transistors are provided on a conductor substrate. However, the present invention is not limited to this configuration. For example, it can be an isolation-type module having a conductor path on the non-conductor substrate. Furthermore, each of the conductor paths (the output conductor path 4 and the drive signal conductor path 7) and each of the terminals (the output terminal 5 and the drive signal terminal 8) can be designed to be incorporated into one unit, or can be individually designed and connected to each other through a bonding wire, etc.

Furthermore, in a plurality of MOS transistors, a MOS transistor provided near the output terminal 5 has a short path of a main current, and a small inductance. Therefore, the bonding wire between the source contact of that MOS transistor and the bridge electrode 11 can be omitted. Examples of omitting a bonding wire between the source contact in a part of a plurality of MOS transistors and the bridge electrode 11 is described below.

Figure 6:
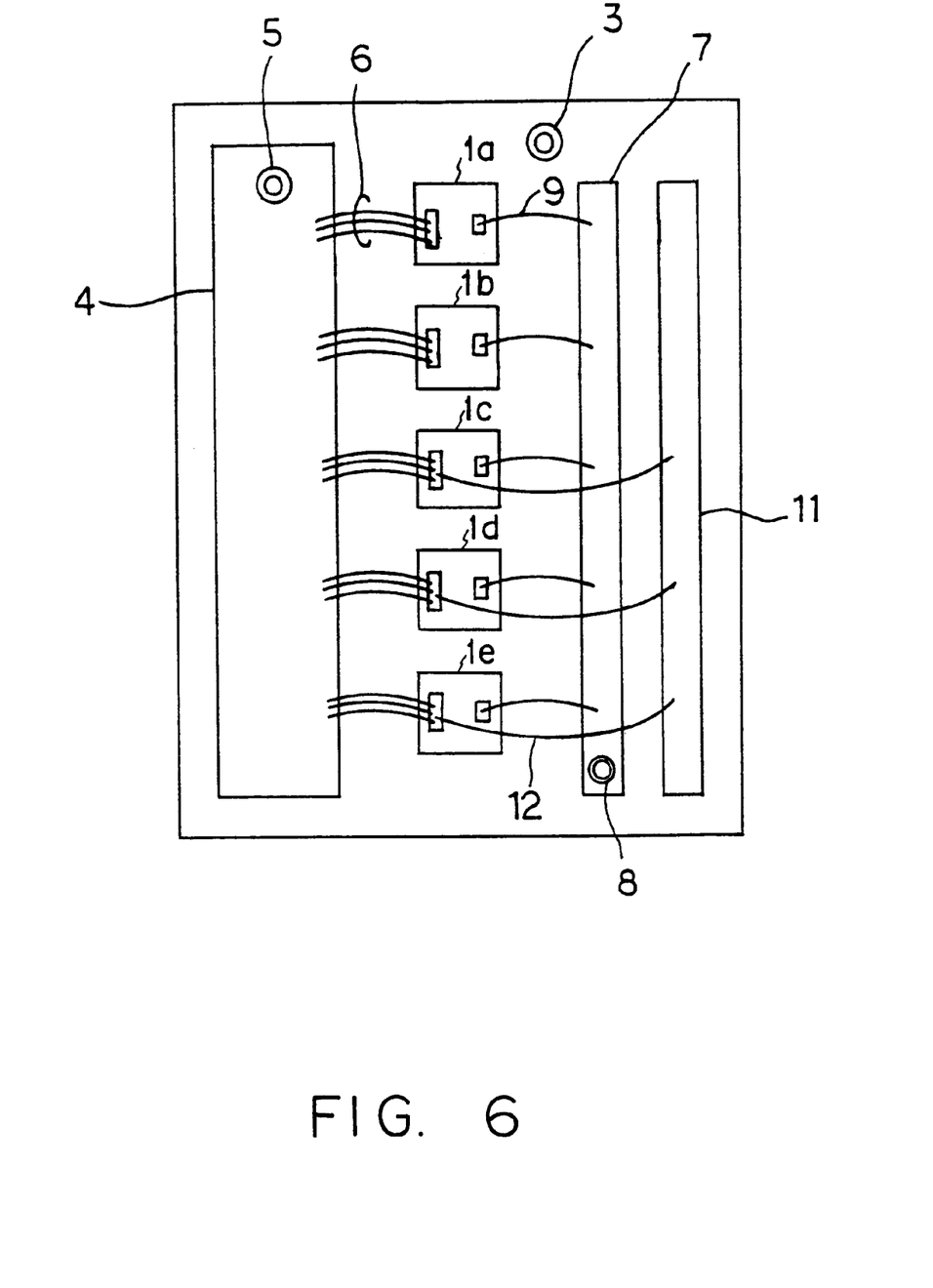
FIG. 6 shows an example (1) of the module in which the connection between the source contact and the bridge electrode is omitted for a part of the MOS transistors.

In the semiconductor module shown in FIG. 6, MOS transistors 1c through 1e provided at the position away from the output terminal 5 in the MOS transistors 1a through 1e arranged on a straight line have respective source contacts connected to the bridge electrode 11 through the bonding wires 12. However, in the MOS transistors 1a and 1b provided near the output terminal 5, respective source contacts are not connected to the bridge electrode 11.

Figure 7:
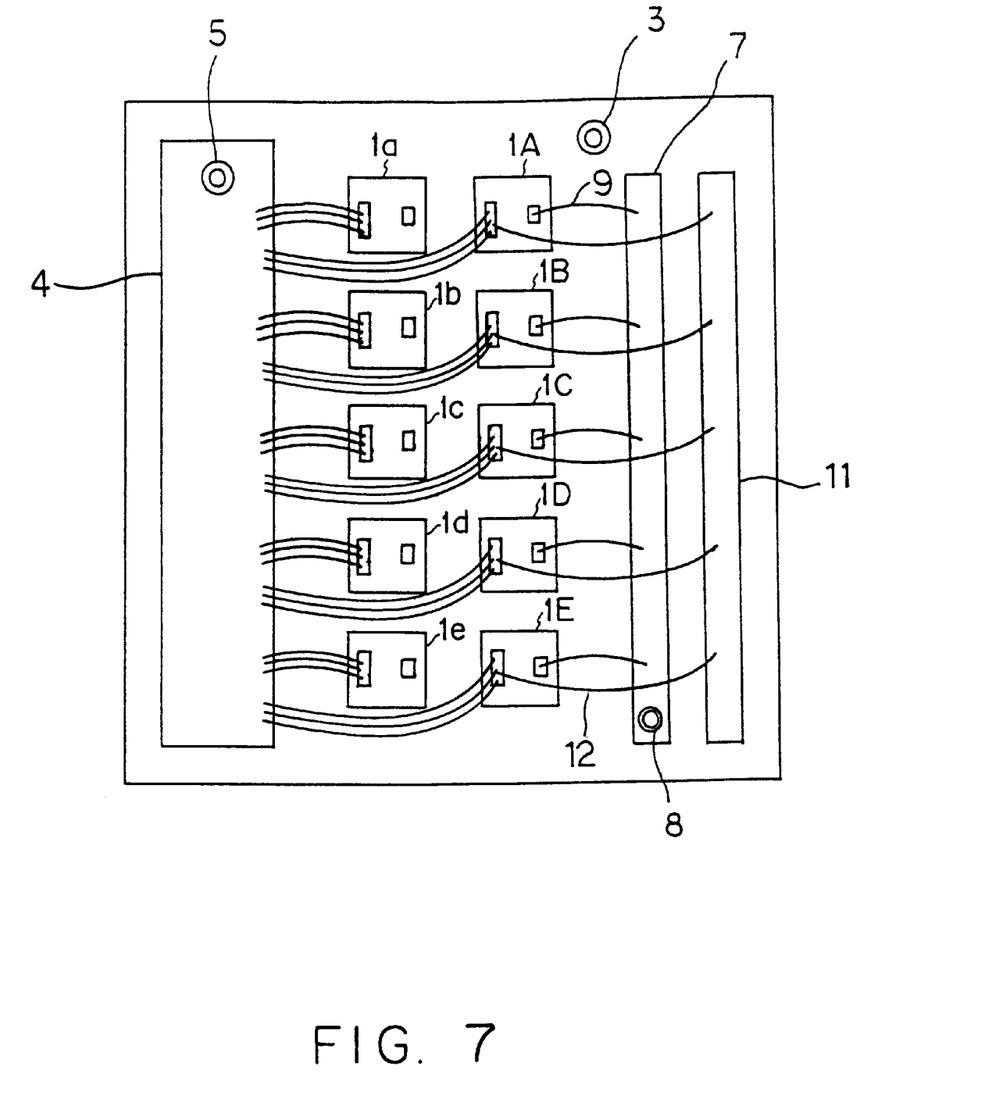
FIG. 7 shows an example (2) of the module in which the connection between the source contact and the bridge electrode is omitted for a part of the MOS transistors.

In the semiconductor module shown in FIG. 7, the MOS transistors 1a through 1e and the MOS transistors 1A through 1E are arranged in a straight line, respectively. In this semiconductor module, the MOS transistors 1A through 1E provided away from the output conductor path 4 directly connected to the output terminal 5 have respective source contacts connected through the bonding wires 12. The MOS transistors 1a through 1e provided near the output conductor path 4 have no source contacts connected to the bridge electrode 11. In FIG. 7, although a bonding wire is not drawn between the gate contact of each of the MOS transistors 1a through 1e and the drive signal conductor path 7, there actually is a bonding wire.

With the configuration shown in FIG. 6 or 7, the number of bonding wires provided in the semiconductor module can be smaller. When the number of bonding wires is small, the number of processes of producing semiconductor modules can be smaller, thereby suppressing the possibility that the bonding wires can touch each other.

In the semiconductor module according to the present invention, with the configuration in which each semiconductor element is drive-controlled based on the potential difference between the drive signal conductor and the output conductor for a main current, a path through which a compensation current flows for compensation of the difference in induction voltage generated for each MOS transistor in the switching operation is furthermore included. Therefore, the operations of a plurality of MOS transistors can be levelled with the surge voltage in the switching process suppressed.

What is claimed is:

1. A semiconductor module in which a plurality of semiconductor elements are interconnected in parallel to each other, comprising:
    a first conductor, having an input terminal, connected to a first main current contact area of each of the plurality of semiconductor elements;
    a second conductor, having an output terminal connected to a second main current contact area of each of the plurality of semiconductor elements;
    a third conductor connected to a drive signal input contact area of each of the plurality of semiconductor elements; and
    a fourth conductor having an interconnection with the second main current contact areas of semiconductor elements positioned at a predetermined distal interval from said output terminal, such that semiconductor elements positioned proximal to the output terminal have no contact areas connected to the fourth conductor, wherein
        determination of the predetermined interval is dependent on inductance present in the interconnection and the semiconductor elements, and
        the plurality of semiconductor elements are drive-controlled based on a potential difference given through said second and third conductors.

2. A semiconductor module in which a plurality of semiconductor elements are interconnected in parallel to each other, comprising:
    a first conductor connected to a first main current contact area of each of the plurality of semiconductor elements;
    a second conductor connected to a second main current contact area of each of the plurality of semiconductor elements;
    a third conductor connected to a drive signal input contact area of each of the plurality of semiconductor elements;
    first, second, and third terminals directly connected to said first, second and third conductors respectively; and
    a fourth conductor having an interconnection with the second main current contact areas of semiconductor elements positioned at a predetermined distal interval from said second terminal, such that semiconductor elements positioned proximal to the second terminal have no contact areas connected to the fourth conductor, wherein
        determination of the predetermined interval is dependent on inductance present in the interconnection and the semiconductor elements; and
        the plurality of semiconductor elements are drive-controlled based on a potential difference given through said second and third conductors.

3. A semiconductor module in which a plurality of MOS transistors are interconnected in parallel to each other, comprising:
    a source electrode, having an output terminal, connected to a source contact area of each of the plurality of MOS transistors; and
    a bridge electrode having an interconnection with source contact areas of MOS transistors provided at a predetermined distal interval from said output terminal such that the MOS transistors positioned proximal to the output terminal have no contact areas connected to the bridge electrode, wherein
        determination of the predetermined interval is dependent on inductance present in the interconnection.

4. A semiconductor module in which a plurality of MOS transistors are interconnected in parallel to each other, comprising:
    a source electrode connected to a source contact area of each of the plurality of MOS transistors;
    a source terminal, connected directly to said source electrode, outputting a source current from said semiconductor module, and
    a bridge electrode having an interconnection with source contact areas of MOS transistors provided at a predetermined distal interval from said source electrode such that the MOS transistors positioned proximal to the source electrode have no contact areas directly connected to the bridge electrode, wherein
        determination of the predetermined interval is dependent on inductance present in the interconnection.

* * * * *